United States Patent
Jung et al.

(10) Patent No.: US 9,583,178 B2
(45) Date of Patent: Feb. 28, 2017

(54) SRAM READ PREFERRED BIT CELL WITH WRITE ASSIST CIRCUIT

(71) Applicant: QUALCOMM Incorporated, San Diego, CA (US)

(72) Inventors: Seong-Ook Jung, Seoul (KR); Younghwi Yang, Seoul (KR); Bin Yang, San Diego, CA (US); Choh Fei Yeap, San Diego, CA (US)

(73) Assignees: QUALCOMM Incorporated, San Diego, CA (US); Industry-Academic Cooperation Foundation Yonsei University, Seoul (KR)

( * ) Notice: Subject to any disclaimer, the term of this patent is extended or adjusted under 35 U.S.C. 154(b) by 274 days.

(21) Appl. No.: 13/741,869

(22) Filed: Jan. 15, 2013

(65) Prior Publication Data
US 2014/0036578 A1 Feb. 6, 2014

Related U.S. Application Data

(60) Provisional application No. 61/679,650, filed on Aug. 3, 2012.

(51) Int. Cl.
G11C 11/00 (2006.01)
G11C 11/412 (2006.01)
G11C 11/419 (2006.01)

(52) U.S. Cl.
CPC .......... *G11C 11/412* (2013.01); *G11C 11/419* (2013.01)

(58) Field of Classification Search
CPC .................................................. G11C 11/412
USPC ....................................................... 365/154
See application file for complete search history.

(56) References Cited

U.S. PATENT DOCUMENTS

| | | | | |
|---|---|---|---|---|
| 5,523,966 A * | 6/1996 | Idei et al. | | 365/156 |
| 6,061,267 A * | 5/2000 | Houston | | 365/154 |
| 7,279,755 B2 * | 10/2007 | Lee et al. | | 257/368 |
| 7,307,907 B2 | 12/2007 | Houston | | |
| 7,345,910 B2 * | 3/2008 | Tsukamoto et al. | | 365/154 |
| 8,125,837 B2 | 2/2012 | Yamaoka et al. | | |
| 8,325,511 B2 * | 12/2012 | Seshadri | | 365/154 |
| 8,461,875 B1 * | 6/2013 | Thompson et al. | | 326/103 |

(Continued)

FOREIGN PATENT DOCUMENTS

CN 101064188 A 10/2007

OTHER PUBLICATIONS

Chris Hyung-il Kim et al., "A Forward Body-Biased Low-Leakage SRAM Cache: Device, Circuit, and Architecture Consideration" IEEE Transactions on VLSI Systems, vol. 13, No. 3, Mar. 2005.*

(Continued)

*Primary Examiner* — Kretelia Graham
(74) *Attorney, Agent, or Firm* — Chui-kiu Teresa Wong; Kenneth Vu

(57) ABSTRACT

Methods and apparatuses for static memory cells. A static memory cell may include a first pass gate transistor including a first back gate node and a second pass gate transistor including a second back gate node. The static memory cell may include a first pull down transistor including a third back gate node and a second pull down transistor including a fourth back gate node. The source node of the first pull down transistor, source node of the second pull down transistor, and first, second, third, and fourth back gate nodes are electrically coupled to each other to form a common node.

18 Claims, 7 Drawing Sheets

(56) References Cited

U.S. PATENT DOCUMENTS

| | | | |
|---|---|---|---|
| 2005/0276094 A1* | 12/2005 | Yamaoka et al. | 365/154 |
| 2007/0253239 A1* | 11/2007 | Wang et al. | 365/154 |
| 2008/0042218 A1* | 2/2008 | Igarashi et al. | 257/391 |
| 2008/0170459 A1* | 7/2008 | Ikeda | G11C 5/147 365/227 |
| 2009/0073746 A1* | 3/2009 | Ng et al. | 365/154 |
| 2011/0261609 A1 | 10/2011 | Seshadri | |
| 2013/0175594 A1* | 7/2013 | Basker | H01L 21/84 257/301 |

OTHER PUBLICATIONS

Manish Dev Singh et al., "Leakage Power Reduction Techniques of 45 nm Static Random Access Memory (SRAM) cells", Int J. of the Phys. Sciences, vol. 6(32), pp. 7341-7353, Dec. 2, 2011.*

Azzez J. Bhavnagarwala et al. A Sub-600-mV, Fluctuation Tolerant 65-nm CMOS SRAM Array with Dynamic Cell Biasing, IEEE Journal of Solid State Circuits, vol. 43, No. 4, Apr. 2008.*

ISSI, "512K×8 High-Speed CMOS Static RAM", Apr. 2005, pp. 1-13.*

International Search Report and Written Opinion—PCT/US2013/053034—ISA/EPO—Oct. 28, 2013.

Hu, et al., "Design and Analysis of Ultra-Thin-Body SOI Based Subthreshold SRAM", ACM 978-1-60558-684-7/09/08, ISLPED'09, Aug. 19-21, 2009, pp. 9-14.

Mukhopadhyay, et al., "Design and Analysis of Thin-Box FD/SOI Devices for Low-Power and Stable SRAM in sub-50nm Technologies", ACM 978-1-59593-709-4/07/0008, ISLPED'07, Aug. 27-29, 2007, pp. 20-25.

Yang et al., "Read-Preferred SRAM with Write-Assist Circuit Using Back-Gate ETSOI Transistors in 22-nm Technology", IEEE Transactions on Electron Devices, vol. 59, Issue. 10, Oct. 2012, p. 2575-2581.

ISSI: "256K X 16 High Speed Asynchronous CMOS Static RAM with 3.3V Supply," Integrated Silicon Solution Inc, IS61LV25616AL, Feb. 2003, 12 pages.

* cited by examiner

SRAM READ PREFERRED BIT CELL WITH WRITE ASSIST CIRCUIT

CROSS REFERENCE TO RELATED APPLICATION

The present application claims the benefit, under 35 U.S.C. §119(e), of U.S. Provisional Patent Application No. 61/679,650, filed on Aug. 3, 2012, in the names of Jung et al., the disclosure of which is expressly incorporated by reference herein in its entirety.

BACKGROUND

Field

Aspects of the present disclosure relate to memory circuits, and more particularly to static random-access memory (SRAM) bit cells with write-assist circuits.

Background

As semiconductor technology scales down, an increasing number of transistors can be integrated into a single chip. Fluctuation of the threshold voltage (Vth), however, increases with technology scaling due to random dopant fluctuation (RDF), line edge roughness (LER), and short channel effects (SCE), which affect small-geometry devices to a greater degree because the threshold voltage can affect individual transistors within a cell. As a result, it is more difficult to analyze the results of using one cell on a semiconductor chip as opposed to a different cell on the same chip.

In particular, as static random-access memory (SRAM) is one of the components in a system-on-chip (SoC) and occupies a large portion of the SoC, an SRAM cell is typically designed using very small transistors for a high integration density. Thus, the stability and write ability of the SRAM gradually degrade, and it is very challenging for SRAM to achieve a sufficient yield in smaller technologies, such as 22 nm technology and beyond, with planar bulk metal-oxide-semiconductor field-effect transistors (MOSFETs).

Extremely thin silicon-on-insulator (ETSOI) materials are attractive candidates for 22 nm and beyond technology nodes to resolve the problems of planar bulk MOSFETs. FIG. 1 shows a schematic cross-sectional view of an ETSOI structure with a back-gate.

A transistor 100 is shown with a source 102, gate 104, and a drain 106 that create changing electric fields that control current flow between the source 102 and drain 106 in a channel 107. A buried oxide (BOX) layer 108 electrically isolates the source 102, the gate 104, and the drain 106 until the proper voltages are placed on the source 102, the gate 104, and the drain 106 contacts to create electrical fields under the gate 104. The gate 104 is insulated from the channel 107 by an insulator layer 109 that allows for current flow. A back-gate 110 is controlled by a well contact 112, which is also electrically coupled to a substrate 114; the back-gate 110 can be used to more precisely control the electrical fields between the source 102 and the drain 106 to open the channel 107. Vth is the threshold voltage specified to create the proper electrical fields across the gate 104, which allows current to flow between the source 102 and the drain 106 in the channel 107.

Random dopant fluctuation (RDF) is the major contributor to the Vth variation, and the extremely thin silicon-on-insulator (ETSOI) material reduces the RDF by using an undoped channel underneath the gate 104. Further, the ETSOI material provides a better short channel control than planar bulk MOSFETs due to the thin channel 107 body. In addition, ETSOI devices with a thin BOX layer 108 can control the Vth by changing the back-gate voltage via the well contact 112, which is similar to body bias in planar bulk MOSFETs, where the substrate voltage is controlled. The leakage current (i.e., current that flows between the source 102 and the drain 106 of the planar bulk MOSFETs) however, drastically increases due to the p-n junction leakage current (between the substrate 114 and the source 102/drain 106) when a forward body (substrate 114) bias is applied. Such a forward bias provides enough of an electric field to the channel 107, which allows current between the source 102 and the drain 106, even when the channel 107 is designed to be closed. Such leakage current in the planar bulk MOSFET body bias approach limits the body bias voltage range that is used to control the RDF and other Vth issues.

SUMMARY

The present disclosure describes methods and apparatuses for static random access memories having a write-assist circuit.

In one aspect of the present disclosure, a static memory cell includes a first pass gate transistor having a first back gate node and a second pass gate transistor having a second back gate node. The cell further includes a first pull down transistor having a third back gate node, and a second pull down transistor comprising a fourth back gate node. The source nodes of the first pull down transistor and the second pull down transistor are electrically coupled to the first, second, third, and fourth back gate nodes to form a common node.

In another aspect of the present disclosure, a method provides a memory cell having a first pass gate transistor that includes a first back gate node, and a second pass gate transistor that includes a second back gate node. A first pull down transistor includes a third back gate node, and a second pull down transistor includes a fourth back gate node. The source nodes of the first and second pull down transistors are electrically coupled to the first, second, third, and fourth back gate nodes to form a common node. The method includes raising a potential of the common node above ground. The method also includes passing current through the first pass gate transistor and the second pass gate transistor while the potential of the common node is above ground.

In another aspect of the present disclosure, a static memory cell includes a first pass gate transistor having a first back gate node and a read preferred gate length, and a second pass gate transistor having a second back gate node and a read preferred gate length. The cell further includes a first pull down transistor having a third back gate node and a read preferred gate width, and a second pull down transistor comprising a fourth back gate node and a read preferred gate width. The source nodes of the first pull down transistor and the second pull down transistor are electrically coupled to the first, second, third, and fourth back gate nodes to form a common node.

In another aspect of the present disclosure, a static memory cell includes a first pass gate transistor having a first back gate node and a second pass gate transistor having a second back gate node and a read preferred gate length. The cell further includes a first pull down transistor having a third back gate node and a read preferred gate width, and a second pull down transistor comprising a fourth back gate node and a read preferred gate width. The source nodes of the first pull down transistor and the second pull down transistor are electrically coupled to the first, second, third, and fourth back gate nodes to form a common node.

A static memory cell in accordance with another aspect of the present disclosure includes a first pass gate transistor having a first means for biasing the first pass gate transistor and a second pass gate transistor having a second means for biasing the second pass gate transistor. The static memory cell further has a first pull down transistor comprising third means for biasing the first pull down transistor and a second pull down transistor comprising fourth means for biasing the second pull down transistor. A source node of the first pull down transistor, a source node of the second pull down transistor, and the first, second, third, and fourth means are electrically coupled to each other to form a common node.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

To achieve a high read stability and write ability, preferred cells are designed by adjusting transistor characteristics, and assist circuits, which are additional circuits for controlling transistor strength.

SRAM Yield Estimation and Design Options

The hold stability, read stability, and write ability of a static random access memory (SRAM) cell depend on a strength ratio of the transistors in the SRAM cells. The hold stability is determined by the pull-up (PU) transistor to the pull-down (PD) transistor strength ratio (also referred to as the gamma ratio), and the read stability is determined by both the pull-down transistor to pass-gate (PG) transistor strength ratio (also referred to as the beta ratio) and the gamma ratio.

The hold stability and read stability are quantified by the hold static noise margin (HSNM) and the read static noise margin (RSNM), respectively. These noise margins are the maximum noise values at the storage node that can be tolerated in the respective modes. The write ability is determined by the PG transistor to the PU transistor strength ratio (also referred to as the alpha ratio) and is described by the word-line write trip voltage (WWTV). The WWTV is quantified as the difference between the nominal voltage (VDD) and the word-line voltage (VWL), where the VWL is the minimum word-line voltage that causes the data to flip in the write operation.

Figure 2:
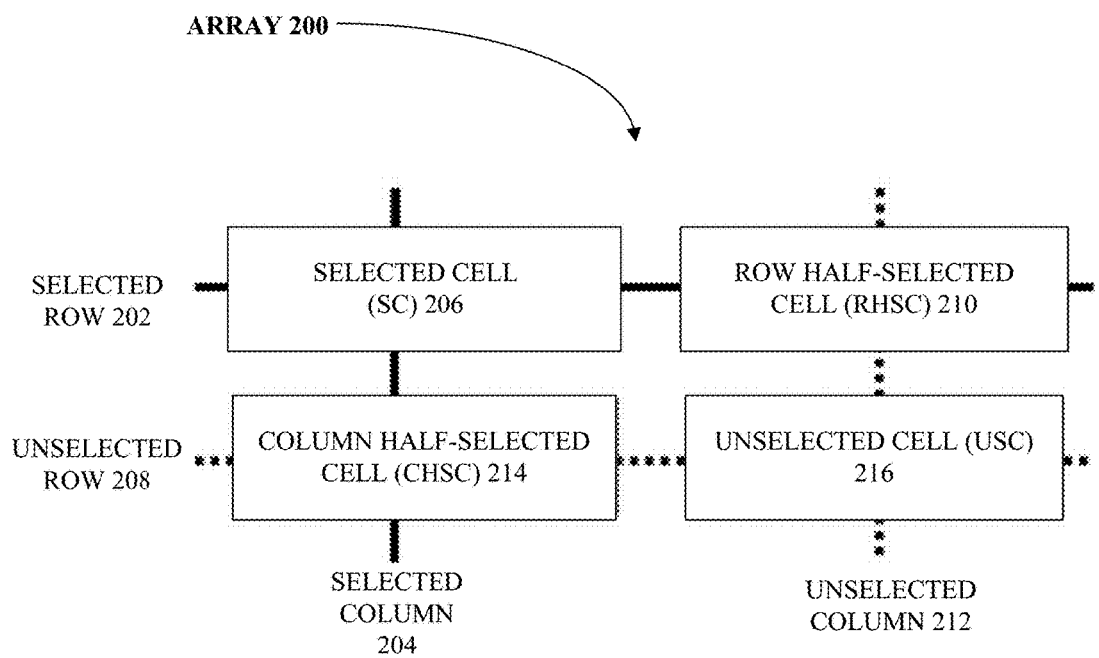
FIG. 2 illustrates an array of cells in an SRAM memory.

FIG. 2 illustrates an array of cells in an SRAM memory. The SRAM array 200 is shown with a selected row 202 and a selected column 204. When the selected row 202 and the selected column 204 are chosen for a memory operation, the selected cell (SC) 206 is the cell in the SRAM array 200 that is operated upon for read or write operations. Other cells in the selected row 202, however, are also partially energized. These cells are referred to as row half-selected cells (RHSC) 210 because they are part of the array that is in an unselected column 212. Similarly, within the selected column 204, other cells are unselected because they are in an unselected row 208, and these cells are referred to as column half-selected cells (CHSC) 214. A cell that is in an unselected row 208 and an unselected column 212 is referred to as an unselected cell (USC) 216.

In many large SRAM arrays, a yield of at least six sigma (6σ) ("6σ-yield") is specified. To achieve the 6σ-yield specification in the SRAM array 200, all the cells including the selected cell 206, the RHSC 210, the CHSC 214, and the unselected cell 216, as shown in FIG. 2, should tolerate a 6σ variation in their operational modes (read, write, and standby modes). Because it is especially hard to achieve a sufficient yield in active modes (read and write modes), read- (write-) assist circuits or read- (write-) preferred cells can be used to improve the read static noise margin (WWTV).

Read- (write-) assist circuits are additional circuits that are used to achieve a high read static noise margin (WWTV). The read- (write-) preferred cell is designed by changing the characteristics of the transistors in the SRAM cell for achieving a high read static noise margin (WWTV), while allowing degradation in the WWTV (read static noise margin). Typically, a read preferred cell cannot be implemented with a write preferred cell at the same time because the size of each transistor in the SRAM cell inversely affects the read static noise margin and WWTV.

In addition, applying both read-assist circuits and write-assist circuits at the same time causes significant circuit complexity. Thus, read-assist circuits, combined with a write preferred cell, or write-assist circuits, combined with a read preferred cell, are attractive for improving both the read static noise margin and WWTV. To evaluate a yield, the concept of a cell sigma is used, which is defined as the mean (μ) divided by the standard deviation (σ). To measure μ and σ of the read static noise margin, WWTV, and HSNM, 1K Monte Carlo simulations may be performed with a Vth variation. The standard deviation of the Vth variation (σVth) due to RDF is determined by the following equation:

$$\sigma_{Vth} = \frac{A_{Vt}}{\sqrt{\text{Width} \times \text{Length}}}$$

where $A_{Vt}$ is a constant depending on the technology proportional to the oxide thickness and the channel doping. However, other variability sources such as line edge roughness and oxide thickness (TOX) variation should be considered. In the present disclosure, $A_{Vt}$ is adjusted to be 1.75 mV·μm to consider other variability sources, however, other values of $A_{Vt}$ and other variables can be used without departing from the scope of the present disclosure. For illustration purposes, the present disclosure uses an independent multi-gate MOSFET model with $V_{DD}$=0.9 V. The technology parameters for such an example for n-channel MOS (NMOS) and p-channel MOS (PMOS) are summarized in Table I. Other voltages and parameters may be used within the scope of the present disclosure; the following is presented merely as one illustration of the parameters that are possible within the scope of the present disclosure.

TABLE I

TECHNOLOGY PARAMETERS FOR $V_{DD}$ = 0.9 V

| Parameter | NMOS | PMOS |
| --- | --- | --- |
| Minimum channel length | 22 nm | 22 nm |
| Body thickness | 6 nm | 6 nm |
| Gate oxide thickness | 1 nm | 1 nm |
| Buried oxide thickness | 10 nm | 10 nm |
| Gate capacitance | 0.673 fF/μm | 0.662 fF/μm |
| Drain capacitance | 0.176 fF/μm | 0.179 fF/μm |
| On current | 640 μA/μm | 480 μA/μm |
| Off current | 0.3 nA/μm | 0.3 nA/μm |
| Threshold voltage ($V_{th}$) | 0.40 V | 0.41 V |
| Body factor (γ) | 0.148 | 0.148 |

$V_{th}$ is measured as the gate to source voltage ($V_{GS}$) when the drain to source current ($I_{ds}$) for each effective width is $10^{-5}$ A/μm with $|V_{DS}|$ = $V_{DD}$.

Read Stability Improvement
Assist Circuits

The read static noise margin can be improved by increasing the beta and gamma ratios, but the beta ratio affects the read static noise margin more directly than the gamma ratio. Read-assist circuits improve the read static noise margin by controlling the word-line voltages, the cell supply voltage (VCELL), the cell ground (VGND), or the back-gate voltage (VBG) of the transistors in the cell. Read-assist circuits are categorized into row-by-row or column-by-column read-assist circuits. A row-by-row read-assist may reduce the VWL of the selected row and thus reduce the strength of the pass-gate, leading to a large beta ratio.

Column-by-column read-assist circuits can increase the VCELL and reduce the VGND of the selected columns, respectively, and thus increase the strength of the pull-down transistor, leading to a large beta ratio. Column-by-column read-assist circuits can, in other configurations, reduce the back-gate voltage of the pull-up transistor (VBG.PU) in the selected columns and thus increase the strength of the pull-up transistor, leading to a large gamma ratio. Thus, read-assist circuits can improve the read static noise margin of the selected cells. However, read-assist circuits can cause several problems, such as increased active leakage current, increased power consumption, and degradation of the word line write trip voltage.

Utilizing a read preferred cell also has inherent problems, such as degrading the word line write trip voltage, or increasing leakage current. Such approaches may also increase the cell area overhead and reduce the six-sigma requirements for SRAM cells.

Thus, increasing both the LPG and the WPD is a more efficient method for improving the read static noise margin without any significant degradation in the cell current (Icell) 306.

Write-assist circuits and write-preferred cells also have similar problems as described above, where designs that increase word line write trip voltage parameters also degrade read static noise margins of RHSCs 210 or CHSCs 214. FIGS. 4A-4B illustrate characteristics of column half-selected cells utilizing different control schemes.

Figure 3:
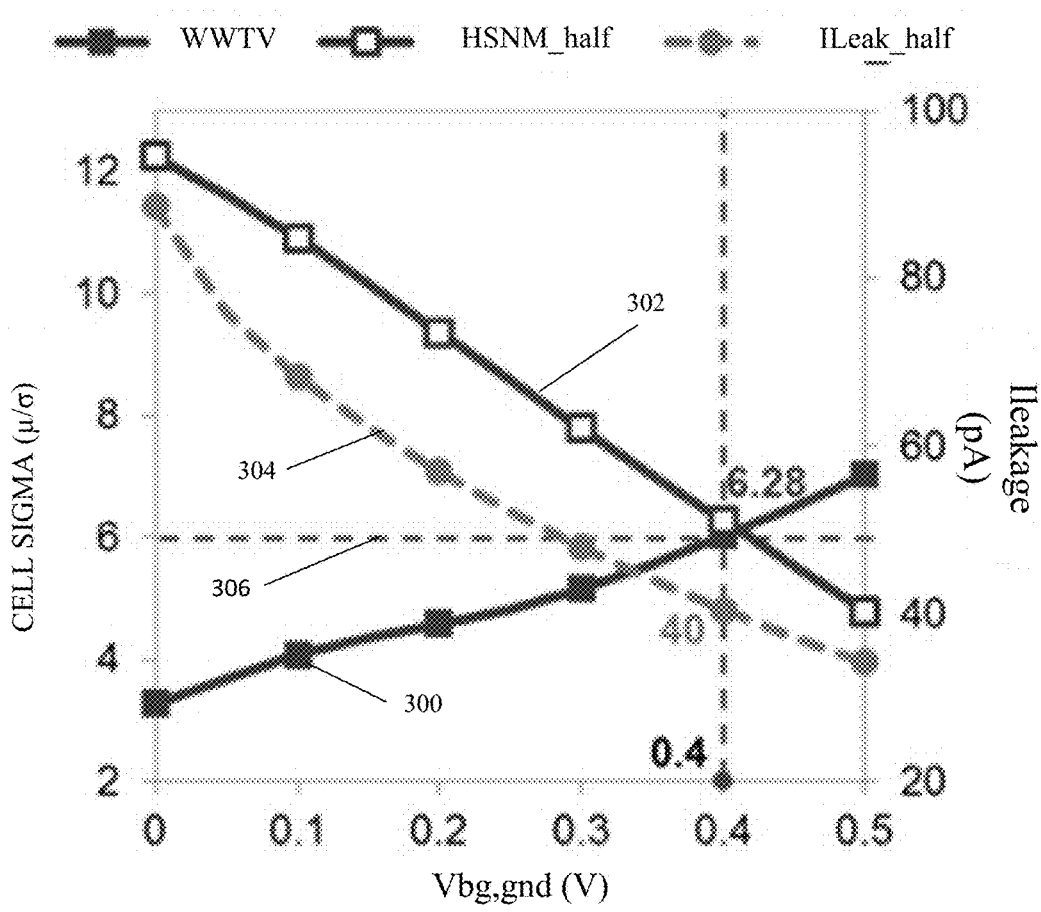
FIG. 3 illustrates word-line write trip voltage (WWTV) in selected cells, the hold static noise margin in column half-selected cells (HSNM_half) and the leakage current in column half-selected cells (ILeak_half) using an aspect of the present disclosure.

FIG. 3 word-line write trip voltage (WWTV) in selected cells, the hold static noise margin in column half-selected cells (HSNM_half) and leakage current in column half-selected cells (ILeak_half) using an aspect of the present disclosure.

FIG. 3 shows the ground/back-gate voltage (Vbg,gnd) plotted along the x-axis and the cell sigma plotted along the y-axis. Using the parameters for the selected cell 206 shown in Table I, values for the WWTV 300, the effects on HSNM_half value 302, and ILeak_half 304 are shown. A minimum of six sigma (y-axis plotting) is specified for cell yield, which is shown as line 306 in FIG. 3.

When the threshold voltage of the pull-down transistor is reduced, the trip voltage (Vtrip) also decreases, which slightly degrades the HSNM. Raising the ground voltage for the cell ($V_{GND}$) above 0 V for the selected columns during the write operation raises Vtrip, which improves the WWTV 300. In addition, the Ileak_half 304 decreases, unlike the pass-gate and pull-down back-gate control scheme, because VDS and VGS decrease due to an increase in $V_{GND}$ and Vth of the pull-down increases due to an increase in the source-body voltage (VSB).

Previous pass-gate and pull-down back-gate control schemes achieve a 6σ yield for all cells through increased dynamic power and increased voltages supplied to the cell. Such previous approaches also increase the leakage current, and the increased power/increased leakage current approaches render the cell less effective in small circuit geometries and thin (e.g., ETSOI) design capabilities. Previous $V_{GND}$ control schemes use smaller dynamic power and do not increase leakage current, however, such approaches cannot achieve a 6σ-yield during the write operation.

To resolve these problems of other cell design approaches, the present disclosure combines the back-gate $V_{BG}$ node of the NMOS with the $V_{GND}$ node. Because both VBG and $V_{GND}$ are increased above 0 V to improve the WWTV 300 during the write operation, it is possible to control VBG and $V_{GND}$ at the same time with a single signal.

Figure 4:
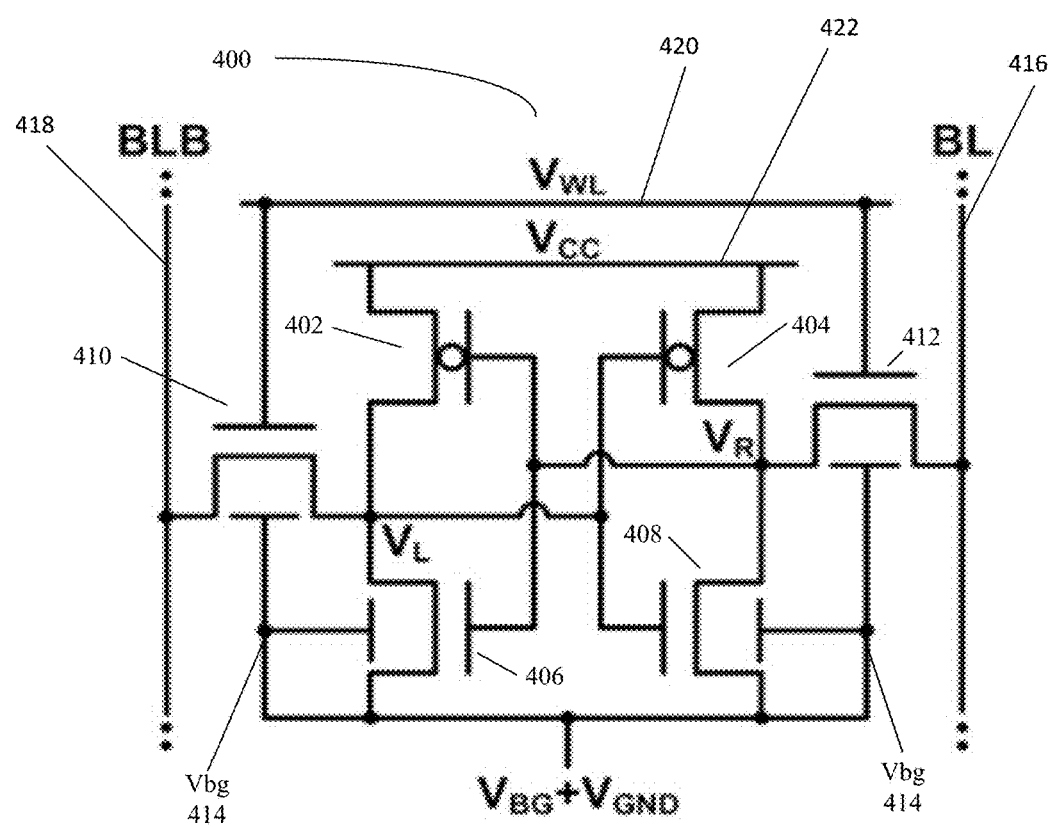
FIG. 4 illustrates a schematic in accordance with an aspect of the present disclosure.

FIG. 4 illustrates a schematic in accordance with an aspect of the present disclosure.

The SRAM cell 400 schematic of the present disclosure includes pull-up transistors (PU transistors 402 and 404) and pull down transistors (PD transistors 406 and 408) coupled as in other SRAM configurations. Pass gate transistors (PG transistors 410 and 412) are coupled such that the back gate of the pass-gate transistors 410 and 412 have a common VBG 414, which is tied to $V_{GND}$, and commonly coupled to the source connections of the pull-down transistors 406 and 408. Compared to the $V_{GND}$ control scheme, there is no more reverse back-bias (RBB) effect for the pull-down transistors 406 and 408, which increases the Vtrip and improves the WWTV, because the common $V_{BG}$ 414 and the $V_{GND}$ are tied in the present disclosure. Instead, there is the forward back-bias (FBB) effect for the pass-gate transistors 410 and 412. This strengthens the pass-gate transistors 410 and 412, which results in a larger WWTV improvement than the reverse back-bias effect for the pull-down transistors 406 and 408. Thus, the specified voltage swing for achieving the 6σ-yield for the WWTV is smaller than that of the previous schemes.

Figure 1:
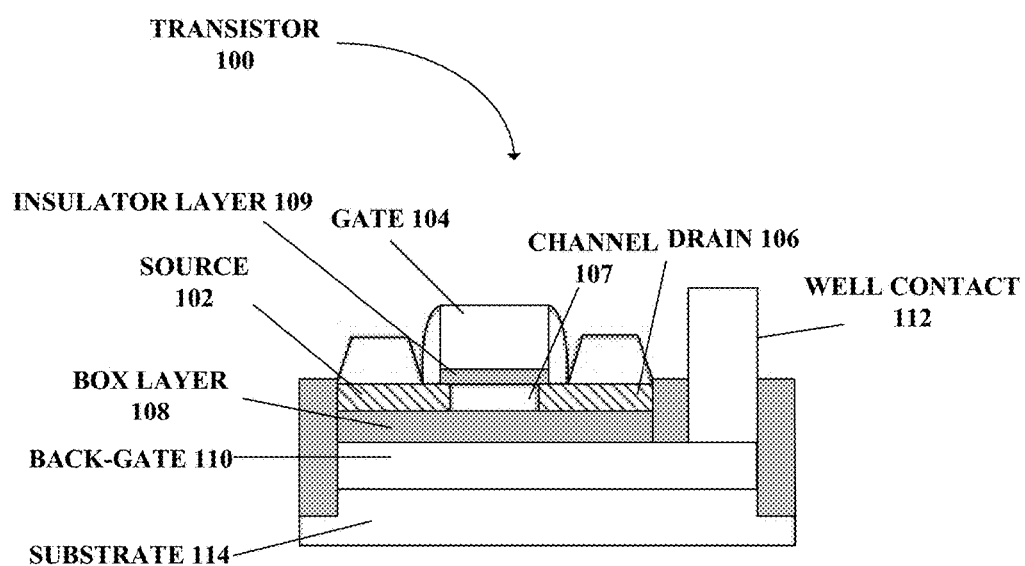
FIG. 1 shows a schematic cross-sectional view of an ETSOI structure with back-gate.

Pass gate transistors (means) 410 and 412 may be used for reading and/or writing to the static memory cell. The pass gate transistors (means) 410 and 412 may have back gate nodes (means) 110 (shown in FIG. 1) for biasing the first pass gate transistors (means) 410 and 412. Pull down transistors (means) 406 and 408 may be used for controlling a state (logic "1", logic "0", or other state) of the memory cell 400. Pull down transistors (means) 406 and 408 may also have back gate nodes (means) 110 (shown in FIG. 1) for biasing the pull down transistors (means) 406 and 408.

The Ileak_half decreases because VDS and VGS are reduced for the pass-gate transistors 410 and 412, as well as for the pull-down transistors 406 and 408, which differs from the pass-gate and pull-down back-gate control scheme. Thus, the power overhead by the write-assist circuit of the present disclosure is reduced. In addition, the present disclosure scheme can reduce degradation of the HSNM_half value 302 caused by a voltage swing better than the $V_{GND}$ control scheme.

The bit line (BL) 416, the bit line bar (BLB) 418, and the word line voltage ($V_{WL}$) 420 are used to read and write to SRAM cell 400. To write into the SRAM cell 400, the BL 416 is driven to a logical "1" state, and the BLB 418 is driven to a logical "0" state. The word line voltage 420 is then selected and the cell is written to as a 1 or a 0.

To read the SRAM cell 400, the BL 416 and BLB 418 are pre-charged to $V_{cc}$ 422 (also known as $V_{DD}$) and the word line voltage 420 is selected. The states of the BL 416 and the BLB 418 will be sensed, as one line of either the BL 416 or the BLB 418 will be pulled low, and a sensing amplifier will sense the difference between the BL 416 and the BLB 418 to determine whether the cell contained a logical 1 or a logical 0.

FIG. 3 shows the WWTV 300 of the selected cell 206, the HSNM_half value 302, and the Ileak_half 304, as a function of $V_{BG}$ and $V_{GND}$ in accordance with the present disclosure. The specified voltage swing to achieve a 6σ-yield WWTV is reduced to 400 mV, which also results in a 6σ-yield for the HSNM_half value 302.

Figure 5:
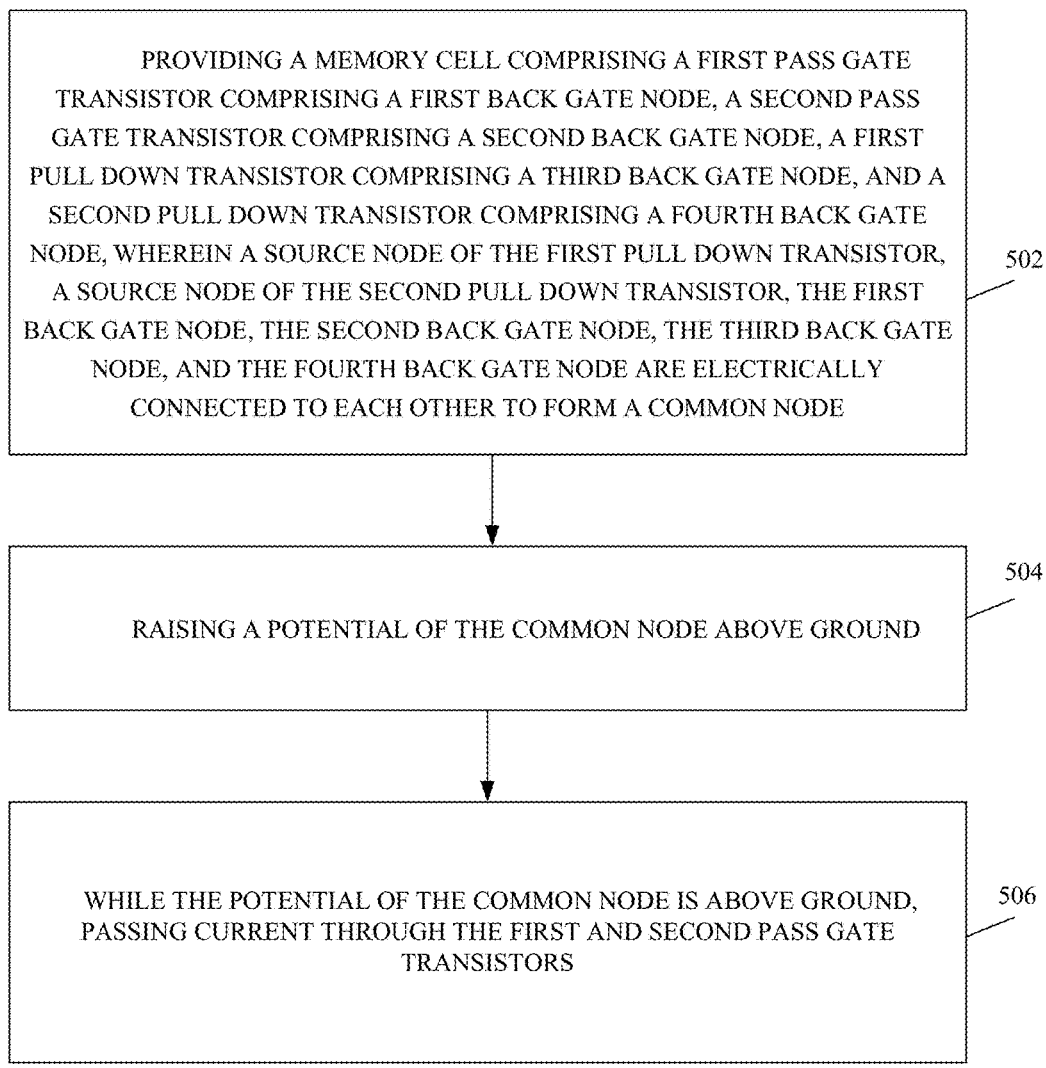
FIG. 5 illustrates a flow chart in accordance with one or more methods of the present disclosure.

FIG. 5 is a flow chart illustrating a method for writing to a static memory cell, in accordance with one aspect of the present disclosure.

Block 500 illustrates providing a memory cell comprising a first pass gate transistor comprising a first back gate node, a second pass gate transistor comprising a second back gate node, a first pull down transistor comprising a third back gate node, and a second pull down transistor comprising a fourth back gate node. A source node of the first pull down transistor, a source node of the second pull down transistor, the first back gate node, the second back gate node, the third back gate node, and the fourth back gate node are electrically coupled to each other to form a common node.

Block 502 illustrates raising a potential of the common node above ground. Block 504 illustrates while the potential of the common node is above ground, passing current through the first and second pass gate transistors.

In one aspect of the present disclosure, a static memory cell includes a first pass gate transistor having a first back gate node and a second pass gate transistor having a second back gate node. The cell further includes a first pull down transistor having a third back gate node, and a second pull down transistor comprising a fourth back gate node. The source nodes of the first pull down transistor and the second pull down transistor are electrically coupled to the first, second, third, and fourth back gate nodes to form a common node.

In another aspect of the present disclosure, a method provides a memory cell having a first pass gate transistor that includes a first back gate node, and a second pass gate transistor that includes a second back gate node. A first pull down transistor includes a third back gate node, and a second pull down transistor includes a fourth back gate node. The source nodes of the first and second pull down transistors are electrically coupled to the first, second, third, and fourth back gate nodes to form a common node. The method includes raising a potential of the common node above ground. The method also includes passing current through the first pass gate transistor and the second pass gate transistor while the potential of the common node is above ground.

In another aspect of the present disclosure, a static memory cell includes a first pass gate transistor having a first back gate node and a read preferred gate length, and a second pass gate transistor having a second back gate node and a read preferred gate length. The cell further includes a first pull down transistor having a third back gate node and a read preferred gate width, and a second pull down transistor comprising a fourth back gate node and a read preferred gate width. The source nodes of the first pull down transistor and the second pull down transistor are electrically coupled to the first, second, third, and fourth back gate nodes to form a common node.

In another aspect of the present disclosure, a static memory cell includes a first pass gate transistor having a first back gate node and a second pass gate transistor having a second back gate node and a read preferred gate length. The cell further includes a first pull down transistor having a third back gate node and a read preferred gate width, and a second pull down transistor comprising a fourth back gate node and a read preferred gate width. The source nodes of the first pull down transistor and the second pull down transistor are electrically coupled to the first, second, third, and fourth back gate nodes to form a common node.

A static memory cell in accordance with another aspect of the present disclosure includes a first pass gate transistor comprising first means for biasing the first pass gate transistor and a second pass gate transistor comprising second means for biasing the second pass gate transistor. The static memory cell further has a first pull down transistor comprising third means for biasing the first pull down transistor and a second pull down transistor comprising fourth means for biasing the second pull down transistor. A source node of the first pull down transistor, a source node of the second pull down transistor, and the first, second, third, and fourth means are electrically coupled to each other to form a common node.

SRAM with back-gate control has recently been of interest because it provides additional design flexibility. To improve both the read static noise margin and the WWTV (wordline write trip value), the present disclosure discloses a read preferred cell with a write-assist circuit. To assist in making the memory cell of the present disclosure a read preferred cell, the memory cell of the present disclosure may have a pass-gate transistor that has an increased gate length compared to at least some of the other gate lengths of other devices in the memory cell (e.g., the pull up transistors or the pull down transistors). Further, to increase the read preference of the cell of the present disclosure, the gate width of the pull down transistors can be increased to be larger than the gate width of at least some of the other devices in the memory cell (e.g., the pull up transistors or the pass gate transistors).

The read preferred cell of the present disclosure can also be designed by increasing both the gate length of the pass-gate transistor and the gate width of the pull-down transistor. Further, the read preferred cell of the present disclosure can be designed by taking into account cell current, leakage current, and cell area overhead. The previous write-assist circuit that uses back-gate control produces a small improvement in the WWTV, but specifies a large voltage swing for a sufficient WWTV. The present disclosure combines the back-gate control with $V_{GND}$ control by simultaneously controlling two nodes. For a 6σ-yield WWTV, the specified voltage swing is reduced, leading to an insignificant dynamic power overhead. In addition, a 6σ-yield is satisfied in all cells with the proposed scheme in contrast to using only VGND control.

Figure 6:
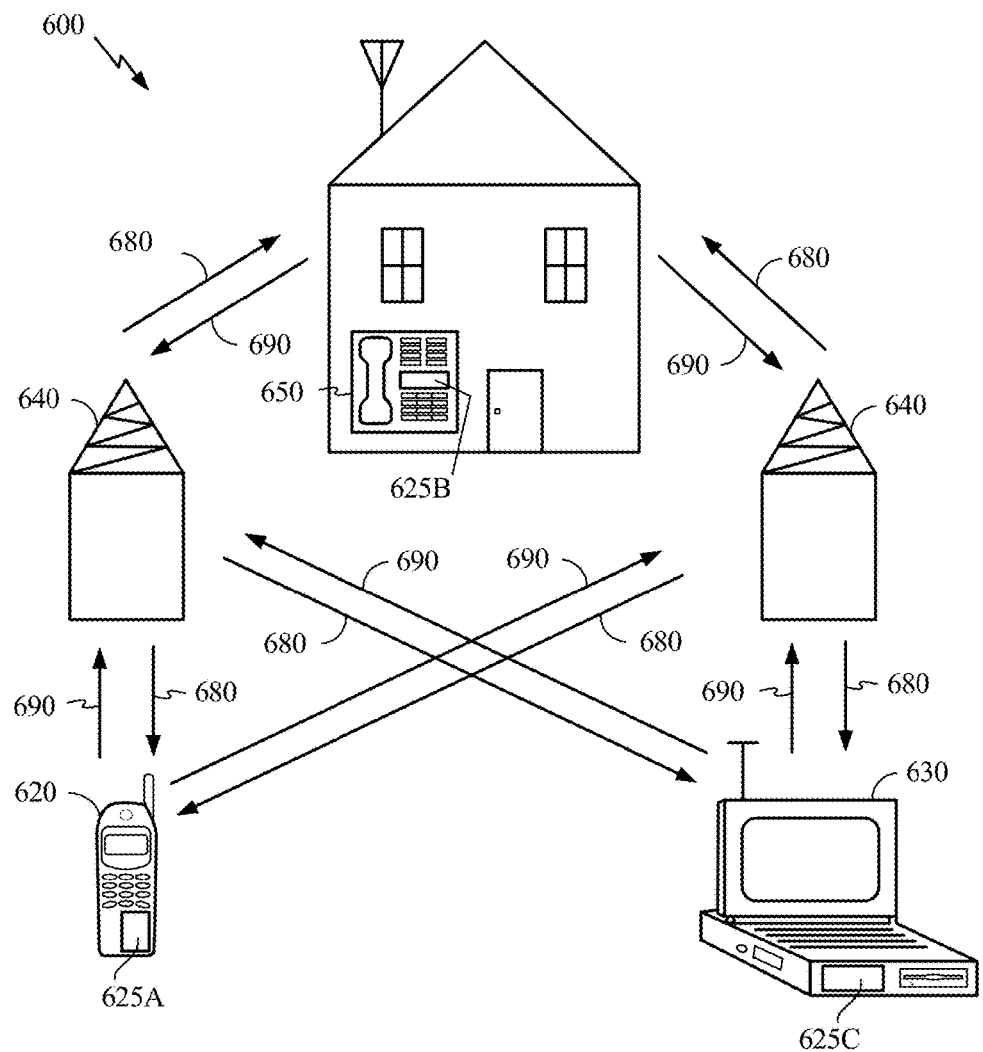
FIG. 6 is a block diagram showing an exemplary wireless communication system in which an aspect of the disclosure may be advantageously employed.

FIG. 6 is a block diagram showing an exemplary wireless communication system 600 in which an aspect of the disclosure may be advantageously employed. For purposes of illustration, FIG. 6 shows three remote units 620, 630, and 650 and two base stations 640. It will be recognized that wireless communication systems may have many more remote units and base stations. Remote units 620, 630, and 650 include IC devices 625A, 625C, and 625B, which include the disclosed circuitry. It will be recognized that any device containing an IC may also include the circuitry disclosed here, including the base stations, switching devices, and network equipment. FIG. 6 shows forward link signals 680 from the two base stations 640 to the remote units 620, 630, and 650 and reverse link signals 690 from the remote units 620, 630, and 650 to the two base stations 640.

In FIG. 6, one of the remote units 620 is shown as a mobile telephone, one of the remote units 630 is shown as a portable computer, and one of the remote units 650 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof. Although FIG. 6 illustrates remote units according to the teachings of the disclosure, the disclosure is not limited to these exemplary illustrated units. Aspects of the disclosure may be suitably employed in any device, which includes integrated circuits (ICs).

Figure 7:
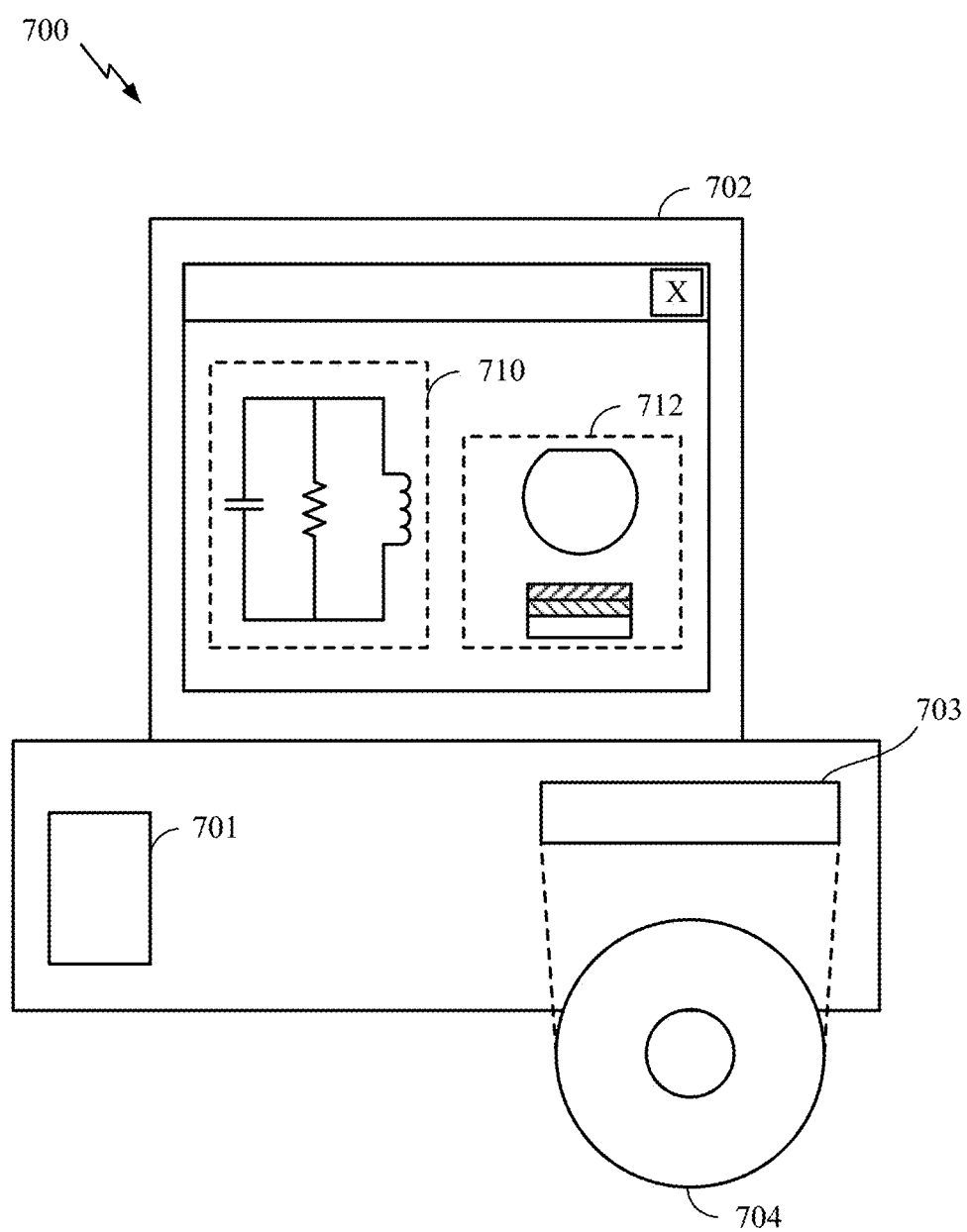
FIG. 7 is a block diagram illustrating a design workstation used for circuit, layout, and logic design of a semiconductor component according to an aspect of the present disclosure.

FIG. 7 is a block diagram illustrating a design workstation used for circuit, layout, and logic design of a semiconductor component, such as circuitry as disclosed above. A design workstation 700 includes a hard disk 701 containing operating system software, support files, and design software such as Cadence or OrCAD. The design workstation 700 also includes a display 702 to facilitate a circuit design 710 or a semiconductor component 712 such as the disclosed circuitry. A storage medium 704 is provided for tangibly storing the circuit design 710 or the semiconductor component 712. The circuit design 710 or the semiconductor component 712 may be stored on the storage medium 704 in a file format such as GDSII or GERBER. The storage medium 704 may be a CD-ROM, DVD, hard disk, flash memory, or other appropriate device. Furthermore, the design workstation 700 includes a drive apparatus 703 for accepting input from or writing output to the storage medium 704.

Data recorded on the storage medium 704 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 704 facilitates the design of the circuit design 710 or the semiconductor component 712 by decreasing the number of processes for designing semiconductor wafers.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus.

For example, a communication apparatus may include a transceiver having signals indicative of instructions and data. The instructions and data are configured to cause one or more processors to implement the functions outlined in the claims.

Although specific circuitry has been set forth, it will be appreciated by those skilled in the art that not all of the disclosed circuitry is specified to practice the disclosure. Moreover, certain well known circuits have not been described, to maintain focus on the disclosure. Similarly, although the description refers to logical "0" and logical "1" in certain locations, one skilled in the art appreciates that the logical values can be switched, with the remainder of the circuit adjusted accordingly, without affecting operation of the present disclosure.

Although the present disclosure and its advantages have been described in detail, it should be understood that various changes, substitutions and alterations can be made herein without departing from the technology of the disclosure as defined by the appended claims. Moreover, the scope of the present application is not intended to be limited to the particular aspects of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding aspects described herein may be utilized according to the present disclosure. Accordingly, the appended claims are intended to include within their scope such processes, machines, manufacture, compositions of matter, means, methods, or steps.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, in which reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A memory comprising:
   a first pass gate transistor comprising a first back gate node situated above a substrate;
   a second pass gate transistor comprising a second back gate node situated above the substrate;
   a first pull down transistor comprising a third back gate node situated above the substrate; and
   a second pull down transistor comprising a fourth back gate node situated above the substrate;
   wherein a source node of the first pull down transistor, a source node of the second pull down transistor, the first back gate node, the second back gate node, the third back gate node, and the fourth back gate node are electrically coupled to each other to form a common node; and
   a voltage source configured to raise a voltage of the common node above ground during a write operation that involves data being passed through the first and second pass gate transistors.

2. The memory of claim 1 wherein the first pass gate transistor is configured to pass the data to the second pull down transistor and the second pass gate transistor is configured to pass the data to the first pull down transistor.

3. The memory of claim 1 further comprising: a first pull up transistor coupled to the first pass gate transistor and the first pull down transistor; and a second pull up transistor coupled to the second pass gate transistor and the second pull down transistor.

4. The memory of claim 1 wherein a body of the first pass gate transistor comprises the first back gate node.

5. The memory of claim 1 wherein a body of the first pull down transistor comprises the third back gate node.

6. A method of writing to a static memory cell comprising:
   providing a memory cell comprising:
      a first pass gate transistor comprising a first back gate node situated above a substrate;
      a second pass gate transistor comprising a second back gate node situated above the substrate;
      a first pull down transistor comprising a third back gate node situated above the substrate; and
      a second pull down transistor comprising a fourth back gate node situated above the substrate;
      wherein a source node of the first pull down transistor, a source node of the second pull down transistor, the first back gate node, the second back gate node, the third back gate node, and the fourth back gate node are electrically coupled to each other to form a common node; and
   raising a potential of the common node above ground during a write operation that involves data being passed through the first and second pass gate transistors.

7. The method of claim 6, wherein the first pass gate transistor is configured to pass current as the data to the second pull down transistor and the second pass gate transistor is configured to pass current as the data to the first pull down transistor.

8. The method of claim 6, further comprising: a first pull up transistor coupled to the first pass gate transistor and the first pull down transistor; and a second pull up transistor coupled to the second pass gate transistor and the second pull down transistor.

9. The method of claim 6, wherein a body of the first pass gate transistor comprises the first back gate node.

10. The method of claim 6, wherein a body of the first pull down transistor comprises the third back gate node.

11. A static memory cell comprising:
   a first pass gate transistor comprising a first back gate node situated above a substrate, and a pass gate read preferred gate length;
   a second pass gate transistor comprising a second back gate node situated above the substrate, and the pass gate read preferred gate length;

a first pull down transistor comprising a third back gate node situated above the substrate, and a pull down read preferred gate width; and a second pull down transistor comprising a fourth back gate node situated above the substrate, and the pull down read preferred gate width;

wherein a source node of the first pull down transistor, a source node of the second pull down transistor, the first back gate node, the second back gate node, the third back gate node, and the fourth back gate node are electrically coupled to each other to form a common node; and wherein the first pass gate transistor is configured to pass data to the second pull down transistor and the second pass gate transistor is configured to pass data to the first pull down transistor in response to a voltage at the common node being raised to a potential higher than zero volts during a write operation.

12. The static memory cell of claim 11, wherein the pass gate read preferred gate length of the first and second pass gate transistors is longer than a gate length of the first and second pull down transistors or other devices in the static memory cell.

13. The static memory cell of claim 11, wherein the read preferred gate width of the first and second pull down transistors is wider than a gate width of the first and second pass gate transistors or other devices in the static memory cell.

14. The static memory cell of claim 11, further comprising: a first pull up transistor coupled to the first pass gate transistor and the first pull down transistor; and a second pull up transistor coupled to the second pass gate transistor and the second pull down transistor.

15. The static memory cell of claim 11, wherein a body of the first pass gate transistor comprises the first back gate node.

16. The static memory cell of claim 11, wherein a body of the first pull down transistor comprises the third back gate node.

17. A static memory cell comprising:
a first pass gate transistor comprising first means for biasing the first pass gate transistor, the first means including a first back gate node situated above a substrate;
a second pass gate transistor comprising second means for biasing the second pass gate transistor, the second means including a second back gate node situated above the substrate;
a first pull down transistor comprising third means for biasing the first pull down transistor, the third means including a third back gate node situated above the substrate; and
a second pull down transistor comprising fourth means for biasing the second pull down transistor, the fourth means including a fourth back gate node situated above the substrate;
wherein a source node of the first pull down transistor, a source node of the second pull down transistor, the first means, the second means, the third means, and the fourth means are electrically coupled to each other to form a common node;
means for raising a potential of the common node above ground; and
means for passing current through the first pass gate transistor and the second pass gate transistor in response to the potential of the common node being raised above ground during a write operation.

18. The memory of claim 1, wherein at least one of the first back gate node, the second back gate node, the third back gate node, or the fourth back gate node is disposed on the substrate.

* * * * *